United States Patent
Purvis et al.

(10) Patent No.: US 7,978,386 B2
(45) Date of Patent: Jul. 12, 2011

(54) GENERATION OF HOLOGRAPHIC DIFFRACTION PATTERNS

(75) Inventors: Alan Purvis, Durham (GB); Richard McWilliam, Durham (GB); Nicholas Luke Seed, Sheffield (GB); Gavin Lewis Williams, Sheffield (GB); Peter Anthony Ivey, Curbar (GB); Andrew Maiden, Penrith (GB); Simon Johnson, Lancaster (GB)

(73) Assignee: University of Durham, Durham (GB)

( * ) Notice: Subject to any disclaimer, the term of this patent is extended or adjusted under 35 U.S.C. 154(b) by 887 days.

(21) Appl. No.: 11/660,895
(22) PCT Filed: Aug. 23, 2005
(86) PCT No.: PCT/GB2005/050135

§ 371 (c)(1),
(2), (4) Date: Nov. 8, 2007

(87) PCT Pub. No.: WO2006/021818

PCT Pub. Date: Mar. 2, 2006

(65) Prior Publication Data

US 2008/0094674 A1    Apr. 24, 2008

(30) Foreign Application Priority Data

Aug. 24, 2004   (GB) .................................. 0418815.7
Oct. 19, 2004   (GB) .................................. 0423170.0

(51) Int. Cl.
*G03H 1/08*   (2006.01)
*G03H 1/26*   (2006.01)

(52) U.S. Cl. ............................................. 359/9; 359/22
(58) Field of Classification Search ........................ None
See application file for complete search history.

(56) References Cited

PUBLICATIONS

XP-002359760—Computer-generated holograms of three-dimensional objects composed of line segments, Ch. Frère, D. Leseberg, and O. Bryngdahl, Optical Society of America/vol. 3, No. 5/May 1986, pp. 726-730.

XP-002359761—Computer-Generated Holograms: Reconstruction of Curves in 3-D, Christian Frère and Olof Bryngdahl, Optics Communications, vol. 60, No. 6, Dec. 1986, pp. 369-372.

XP-00284785—A Technique for projection x-ray lithography using computer-generated holograms, Chris Jacobsen and Malcolm R. Howells, Journal of Applied Physics 71 (1992) Mar. 15, No. 6, New York, pp. 2993-3001.

XP-000638749—Wafer Through-Hole Interconnections with High Vertical Wiring Densities, Carsten Christensen, Member, IEEE, Peter Kersten, Sascha Henke, and Siebe Bouwstra, IEEE Transactions on Components, Packaging and Manufacturing Technology—Part A, vol. 19, No. 4, Dec. 1996, pp. 516-521.

XP-002359762—Nonplanar photolithography with computer-generated holograms, A. Maiden, R. McWilliam, A. Purvis and S. Johnson, Optical Society of America, Optics Letters/vol. 30, No. 11/Jun. 1, 2005, pp. 1300-1302.

*Primary Examiner* — Stephone B Allen
*Assistant Examiner* — Jade R Chwasz
(74) *Attorney, Agent, or Firm* — Drinker Biddle & Reath LLP

(57) ABSTRACT

A method of generating a holographic diffraction pattern and a holographic lithography system. The method involves defining at least one geometrical shape; generating at least one line segment to represent the at least one geometrical shape; calculating a line diffraction pattern on a hologram plane, including calculating the Fresnel diffraction equation for an impulse representing the at least one line segment with a line width control term and a line length control term; and adding vectorially, where there are two or more line segments, the line diffraction patterns to form the holographic diffraction pattern. The method and system enables holographic masks to be generated without creating a physical object to record. The required shapes or patterns are defined in terms of a three-dimensional coordinate space and a holographic pattern is generated at a defined distance from the shapes in the coordinate space.

12 Claims, 7 Drawing Sheets

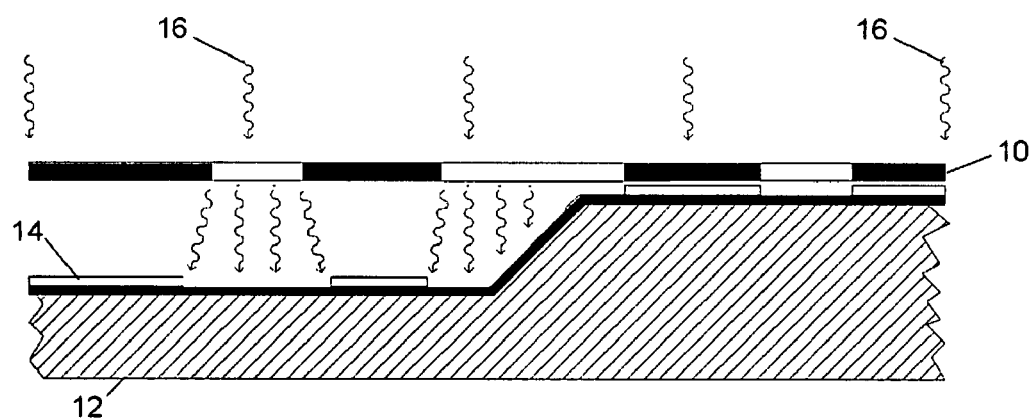
[Fig. 1]
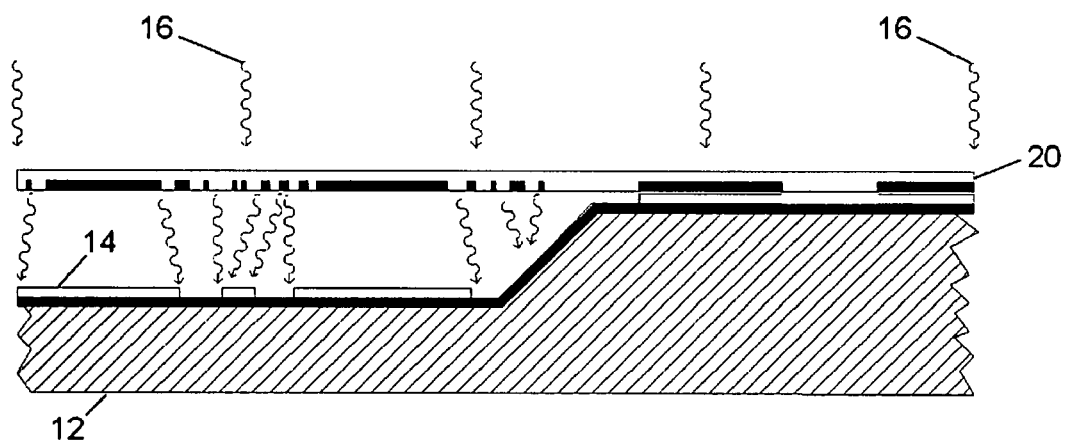
[Fig. 2]

[Fig. 3]
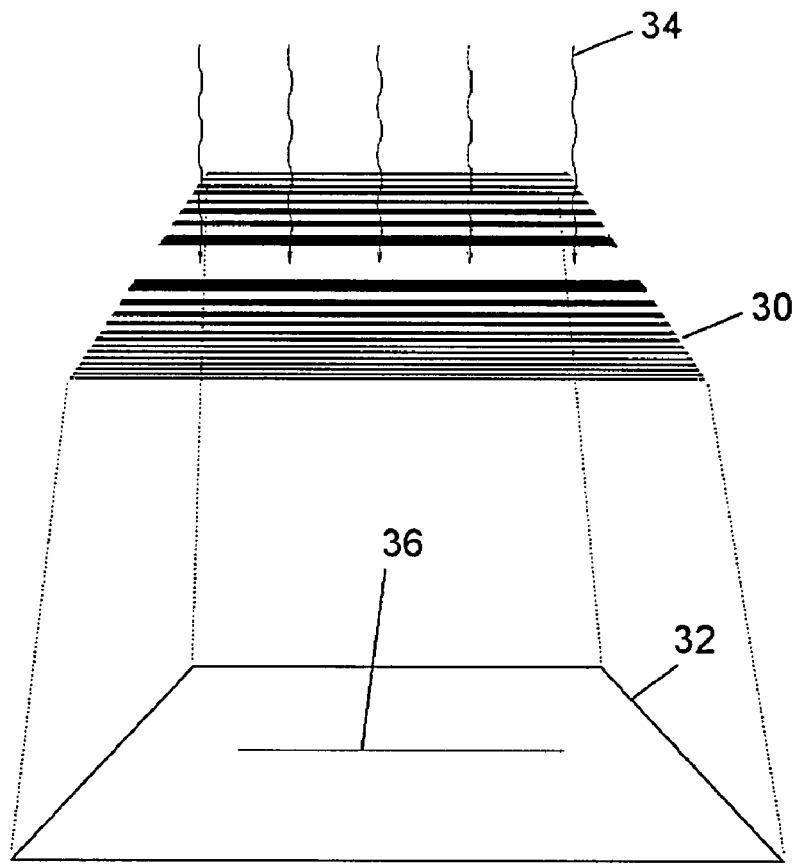
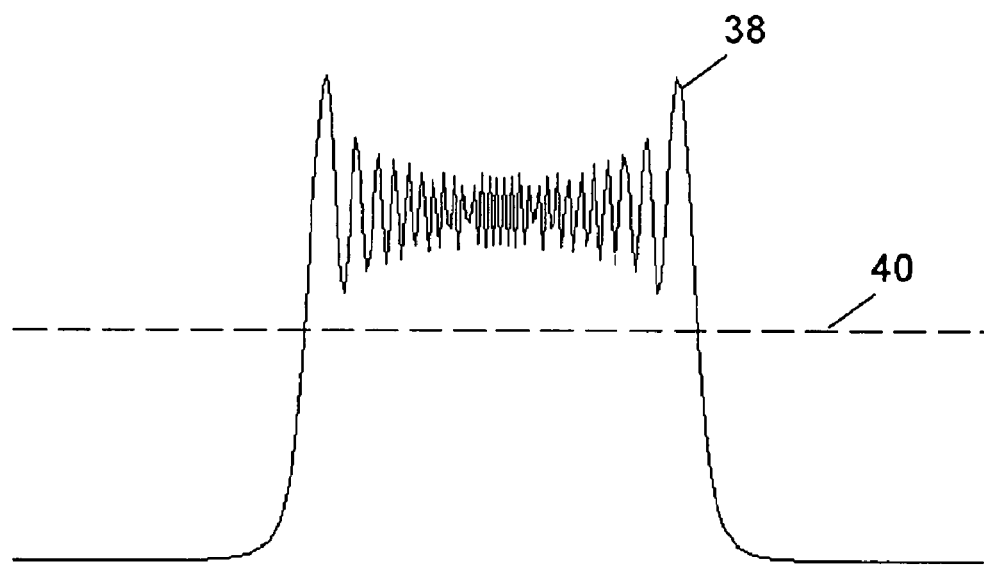

[Fig. 4]
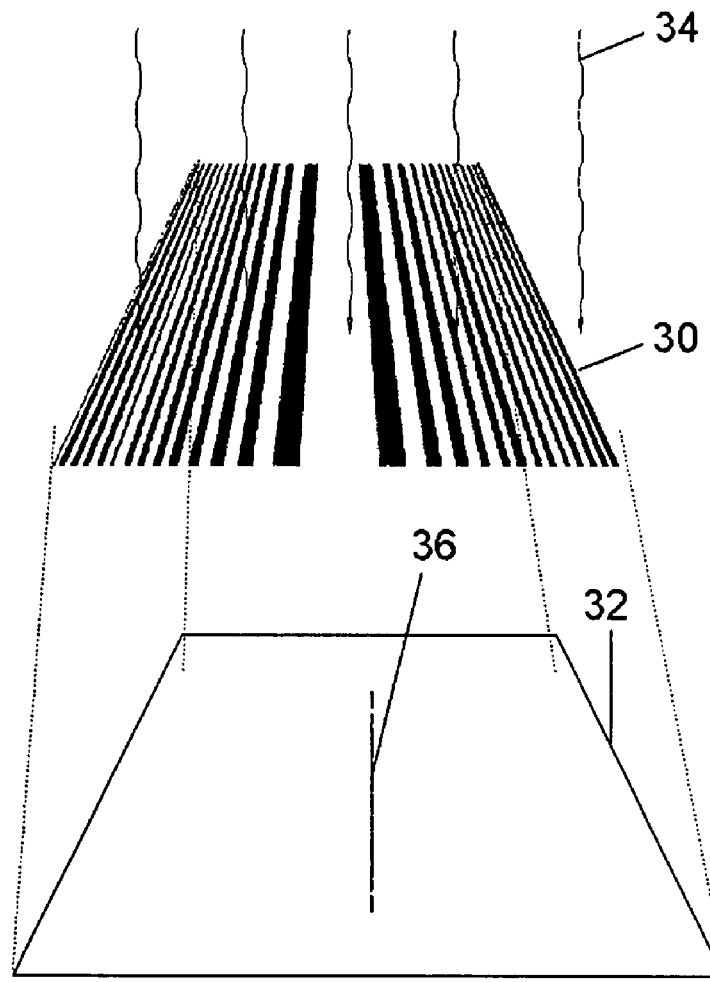
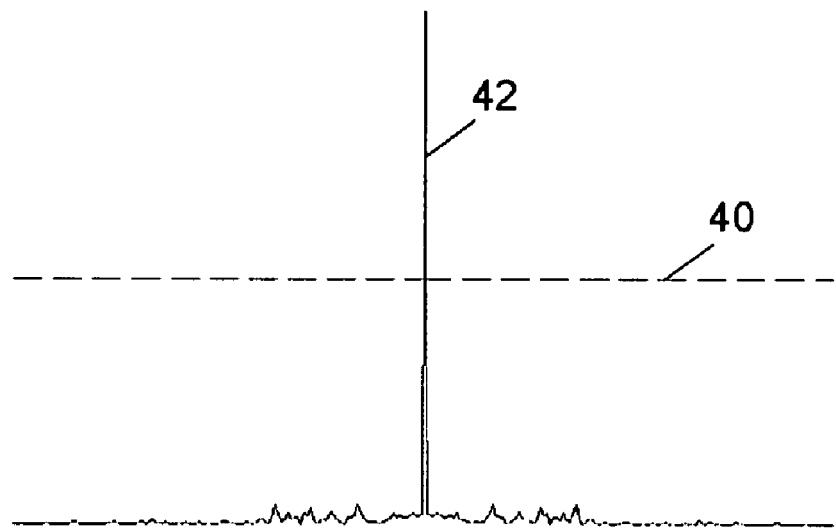

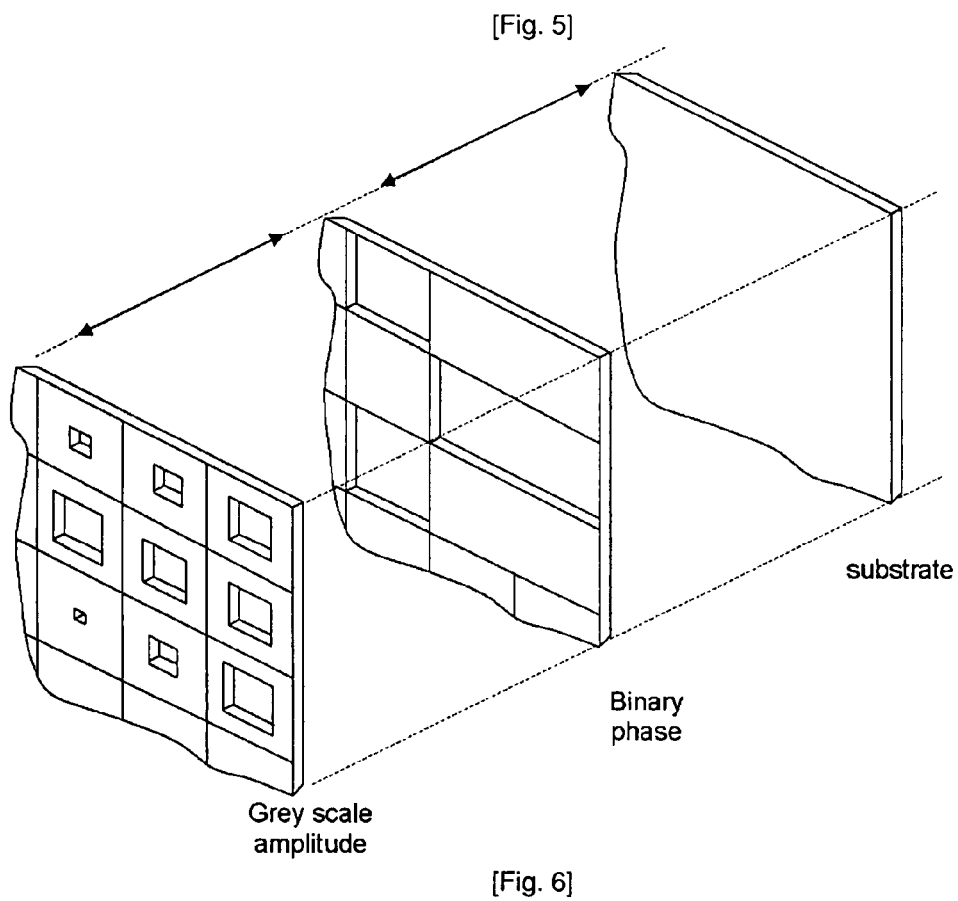
[Fig. 5]
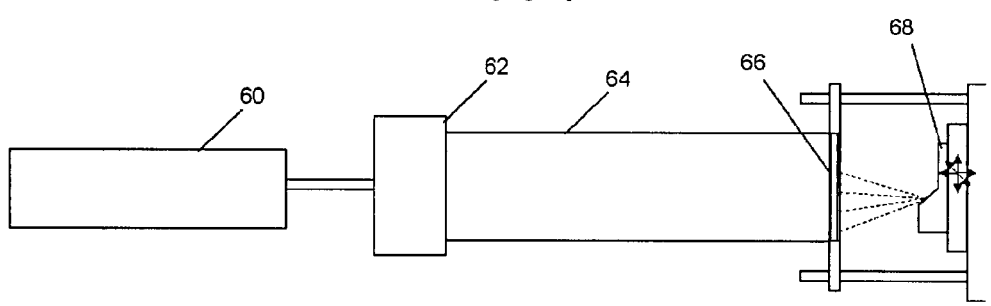
FIG. 6

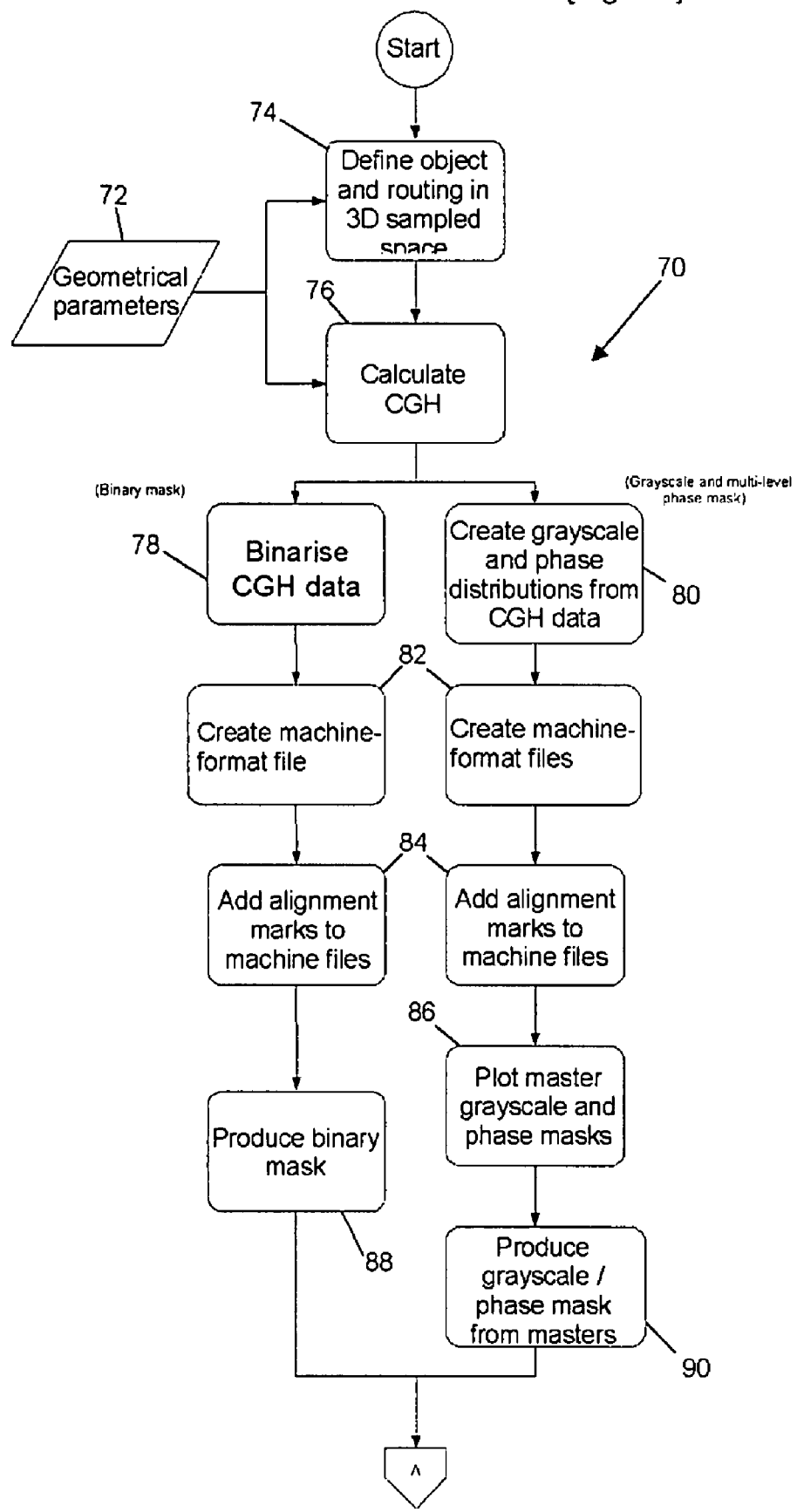
[Fig. 7A]

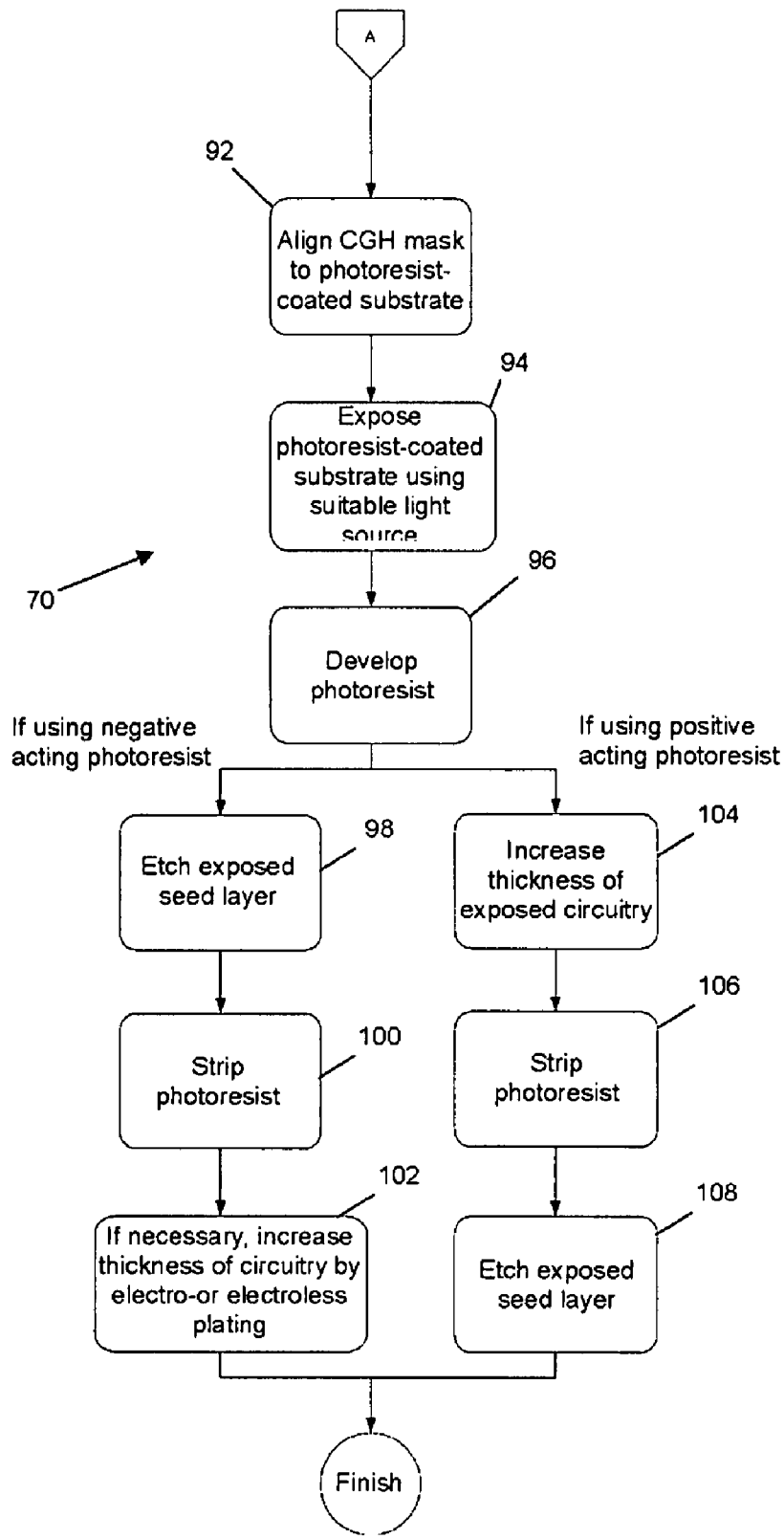
[Fig. 7B]

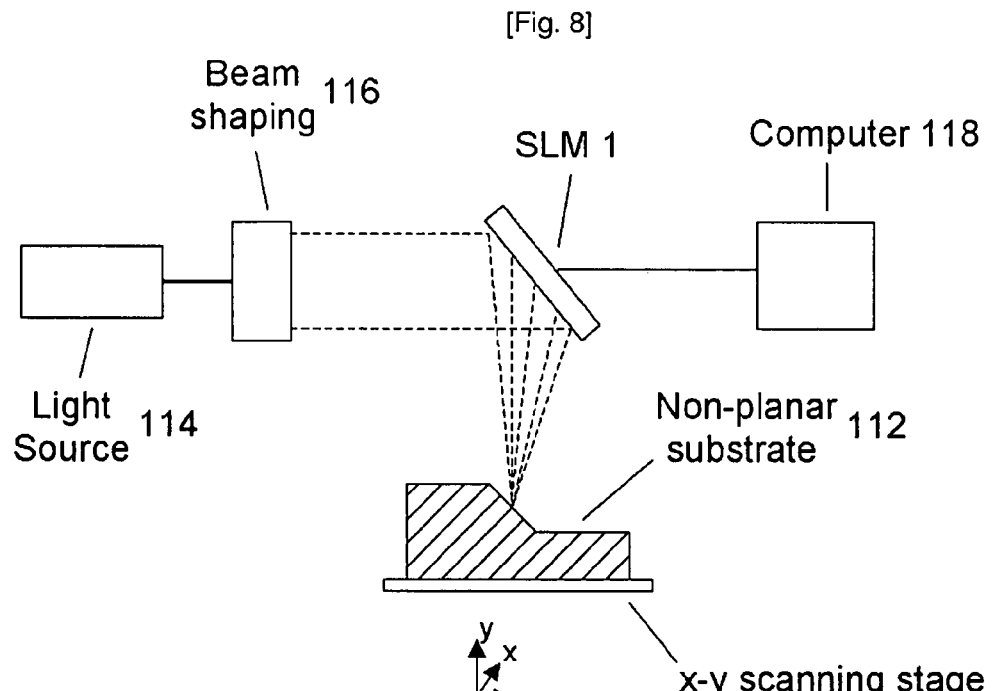
[Fig. 8]
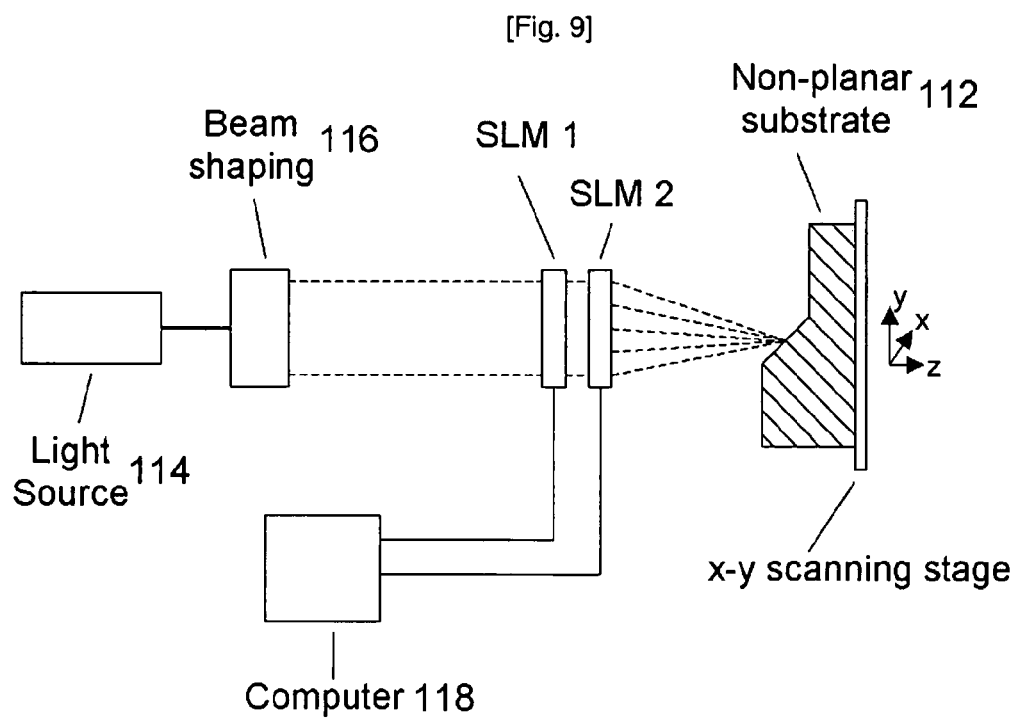
[Fig. 9]

GENERATION OF HOLOGRAPHIC DIFFRACTION PATTERNS

FIELD OF THE INVENTION

The present invention relates to holographic lithography and particularly, but not exclusively, to computer generated holographic lithography in three-dimensions.

BACKGROUND

Lithography and, in particular, photolithography is a well-known technique in semi-conductor and printed circuit board (PCB) manufacture for creating electrical components and circuits. Photolithography involves placing a mask in front of a substrate, which has been covered by a layer of photoresist, before exposing to light. The areas of photoresist exposed to the light react and change chemical properties compared with the unexposed photoresist. The photoresist is then developed for removing either the exposed portions of photoresist for a positive resist or unexposed portions for a negative resist. The pattern formed in the photoresist allows further process steps to be performed on the substrate, such as, but not limited to, etching, deposition or implantation.

The resolution of photolithography is limited by the diffraction of light from the mask features. As the separation between the mask and the substrate increases, so the minimum feature size increases, thus fine-line photolithographic methods are only suitable for flat surfaces. Photolithography on non-planar surfaces has been achieved by moulding the mask to the shape of the substrate prior to exposing. This specialised technique is only suitable for large simple shapes.

Holographic masks have been constructed using a traditional Total Internal Reflection (TIR) holographic technique to pattern sub-micron features onto large (for example, 15×15 inch) flat substrates. The holographic mask is much more robust to defects than a standard mask and does not need to be in intimate contact with the substrate in order to generate high definition features. Techniques have also been devised for projecting a pair of TIR holographic masks onto a spherical substrate. The technique involves a complicated optical set-up to generate the holograms.

Systems for creating Computer Generated Holograms (CGHs), mainly for use in holographic displays, have also been devised. CGHs are created by defining an object or shape geometrically inside a computer and computing the required patterning of a diffraction mask. A holographic image of that object is created when a suitable light source is emitted towards the diffraction mask.

A CGH system designs the holographic interference pattern which is plotted or printed. A hologram is generated when the pattern is exposed to a monochromatic light source. In common use, and in this context, CGH describes the whole process of creating a hologram from generation of interference pattern within a computer to exposure of the pattern to a light source.

Conventionally, CGH patterns for the projection of a light distribution into a 3D volume have been calculated in a number of ways including:
1. split the volume into a number of slices and compute the Fresnel Diffraction Formula (FDF) for each slice;
2. split the volume into a number of planar segments at various inclinations to the hologram plane and superimpose the results of the FDF for each planar segment; and
3. decompose the object within the volume into line segments and superimpose the results of the FDF for each line segment.

The first method requires an optical calculation for every slice through the object volume, each comprising a two-dimensional Fourier Transform and multiplicative factors. Similarly, the second method requires calculation of a two-dimensional Fourier Transform, multiplication by exponential phase factors and a coordinate transform for each plane into which the object has been split. Calculation of diffraction patterns using these methods for large or high-resolution diffraction masks is computationally expensive.

Calculations based on the third method are more efficient, because the pattern in the hologram plane can be calculated analytically. This is demonstrated in "Computer-generated holograms of three-dimensional objects composed of line segments" Ch. Frére, D. Lesenberg, O. Bryngdahl, J Optical Society of America 3 (1986) 726-730, where the technique is used in relation to generating a holographic display. Unfortunately, this method does not provide adequate means for precisely controlling line width and length and therefore cannot be used for precise applications.

SUMMARY OF THE DISCLOSURE

According to a first aspect of the present invention there is provided a method of generating a holographic diffraction pattern, the method comprising the steps of:
(i). defining at least one geometrical shape;
(ii). generating at least one line segment to represent the at least one geometrical shape;
(iii). calculating a line diffraction pattern on a hologram plane, including calculating the Fresnel diffraction equation for an impulse representing the at least one line segment with a line width control term and a line length control term; and
(iv). adding vectorially, where there are two or more line segments, the line diffraction patterns to form the holographic diffraction pattern.

Preferably, the at least one geometrical shape is a three-dimensional geometrical shape.

Preferably, the line diffraction pattern is defined by a function H(x,y) and the projected image as a result of a suitable radiation source being diffracted by the line diffraction pattern is defined by a function U(u,v).

Preferably, the line width control term is:

$$SINC\left(\frac{wy}{\lambda z}\right),$$

where w is the width of the line segment and $\lambda$ is the wavelength of a suitable radiation source.

Preferably, the line length control term is:

$$\int_{-h/2}^{h/2} \exp\left(j\frac{\pi(x-u)^2}{\lambda z}\right) \cdot du,$$

where h is the length of the line segment.

Preferably, step (iii) comprises calculating a partial holographic pattern representing an area of the holographic plane less than the total area of said holographic plane.

Preferably, the method further comprises the step of identifying any point in the at least one geometrical shape wherein two or more line segments will cross, calculating a point diffraction pattern of an identified point and subtracting the point diffraction pattern from the holographic diffraction pattern.

According to a second aspect of the present invention, there is provided a holographic lithography system comprising:
geometrical shape definition means for defining a geometrical shape;
holographic diffraction generation means, wherein the geometrical shape is defined by at least one line segment, a line diffraction pattern is calculated on a hologram plane including a line width control term and a line length control term and, where there is more than one line diffraction pattern, the line diffraction patterns are added vectorially together to form a holographic diffraction pattern;
holographic mask generation means, wherein the complex values of the holographic diffraction pattern are used to generate a holographic mask;
photoresist deposition means, wherein photoresist is deposited onto a substrate; and
monochromatic light exposure means, wherein the holographic mask is aligned to the substrate and exposed to the monochromatic light.

In this context, monochromatic light is taken to mean narrow band illumination, as typically seen from laser sources, but may include other relatively narrow band light sources.

Preferably, the photoresist deposition means deposits electro-depositable photoresist (EDPR) enabling uniform photoresist coverage of the substrate.

Subsequent steps after exposure of photoresist use standard processes such as metal build-up, metal etch and exposed or unexposed photoresist removal from the substrate.

According a third aspect of the present invention there is provided a computer program product directly loadable into the internal memory of a digital computer comprising software code portions for performing the method according to the first aspect of the present invention.

BRIEF DESCRIPTION OF THE DRAWINGS

Embodiments of the present invention will now be described, by way of example only, with reference to the accompanying drawings, in which;

FIG. 1 illustrates a prior art standard photolithography process on a non-planar substrate;

FIG. 2 illustrates an embodiment of a holographic photolithography process according to the present invention on a non-planar substrate;

FIG. 3 illustrates an embodiment of a holographic projection of a line segment along the length.

FIG. 4 illustrates an embodiment of a holographic projection of a line segment across the width.

FIG. 5 illustrates an embodiment of layers of a grey-scale/binary phase mask;

FIG. 6 illustrates an embodiment of a holographic photolithography system according to the present invention;

FIG. 7a illustrates an embodiment of a first part of a lithography process according to the present invention;

FIG. 7b illustrates an embodiment of a second part of a lithography process according to the present invention;

FIG. 8 illustrates an embodiment of a maskless photolithography process based on a single reflective Spatial Light Modulator (SLM); and FIG. 9 illustrates an embodiment of a maskless photolithography process based on dual transmissive SLMs.

DETAILED DESCRIPTION OF THE PREFERRED EMBODIMENTS

Referring to FIG. 1, a prior art photolithography process has a mask 10, substrate 12, photoresist 14 and electromagnetic radiation 16, which in this case is a suitable light source. The substrate 12 is non-planar which means that the mask 10 cannot sit directly on the surface of the photoresist 14 on all of the required area. Where there is a gap between the mask 10 and the photoresist 14, the light 16 diffracts from the mask 10 before reaching the photoresist 14. The minimum feature size that the mask 10 can produce is affected as the diffraction of the light 16 impinges on a larger area of photoresist than the area of the mask 10.

Referring now to FIG. 2, a holographic mask 20 is now used above the non-planar substrate 12. The holographic mask 20 diffracts the light 16 appropriately according to the distance between the holographic mask 20 and the photoresist 14. Exposed areas of photoresist are targeted according to how the light 16 is expected to diffract through the holographic mask 20.

The present invention enables holographic masks to be generated without creating a physical object to record. The required shapes or patterns are defined in terms of a three-dimensional co-ordinate space and a holographic pattern is generated at a defined distance from the shapes in the co-ordinate space. The holographic pattern is usually termed a Computer Generated Hologram (CGH) as the patterns are normally created within computers. A holographic mask can then be created from the holographic pattern to enable the photolithography of a substrate.

Once a shape has been defined in the co-ordinate space, the shape is separated into one or more line segments. For each line segment a line diffraction pattern is calculated.

A single line in space is firstly defined as:

$$U(u,v)=\delta(u) \quad \text{(Eq. 1)}$$

that is, an impulse at u=0 extending to ± infinity in v-direction, where u and v represent an object co-ordinate plane within which the line, or shape, is defined.

A hologram co-ordinate plane is defined by x and y with the hologram plane and object plane sharing a common optical axis z.

For a hologram-image separation z, the line diffraction pattern of the impulse on the hologram plane H(x,y) is given by: (Eq. 2)

$$H(x, y) = \exp\left(j\frac{\pi y^2}{\lambda z}\right)$$

where λ is the wavelength of the illuminating monochromatic light source.

The equivalent expression to (2) for a line at an angle α to the optical axis is given by: (Eq. 3)

$$H(x, y) = \exp\left(j\frac{\pi y^2}{\lambda z_x}\right)$$

Where $z_x$ is the distance between the mask and the substrate at a given position along the x-axis.

Truncating the analytical distribution H(x,y) to a finite sized mask of sides a and b results in a reconstructed image U(u,v) in the form of equation (4): (Eq. 4):

$$U(u, v) = f(u) \cdot \frac{a}{\sqrt{\lambda z}} SINC\left(\frac{av}{\lambda z}\right)$$

The image resulting from the truncated distribution H(x,y) takes the form of a SINC function in the v direction, modulated by a Fresnel Integral, f(u), in the u-direction. The intensity of the line segment in the image plane therefore varies as SINC² in the v-direction and can be approximated by a RECT function for large values of b in the u-direction.

SINC, in the context of this invention, is defined as shown in Equation (5): (Eq. 5):

$$SINC(x) = \frac{\sin(\pi x)}{\pi x}$$

RECT, in the context of this invention, is defined as shown in Equation (6): (Eq. 6):

$$RECT(x) = \begin{cases} 0 & \text{for } |x| > \frac{1}{2} \\ \frac{1}{2} & \text{for } |x| = \frac{1}{2} \\ 1 & \text{for } |x| < \frac{1}{2} \end{cases}$$

Consideration of aliasing effects in the mask shows that the minimum achievable line width is equal to the sample spacing in the y-direction of the diffraction pattern, independent of the hologram-substrate separation, z.

Equation (4) suggests that for a fixed substrate mask separation the only mechanism available to adjust the width of a line-segment is the extent of the diffraction pattern in the y-direction. Maintaining a constant width of the main lobe of the SINC function for different z values results in variations in the intensity of the line. It is therefore difficult to maintain a constant line cross-section over a large z range or to effectively alter the width of a line segment.

Equation (2) is improved in two ways from the point of view of lithography; a line width control term is introduced to allow effective control of the width of the line-segment and an integral term representing line length control is added to improve the drop-off at the ends of the lines and to smooth the intensity along it.

The distribution for a line of width w and length h in the line diffraction pattern then becomes: (Eq. 7)

$$H(x, y) = \exp\left(j\frac{\pi y^2}{\lambda z}\right) SINC\left(\frac{wy}{\lambda z}\right) \int_{-h/2}^{h/2} \exp\left(j\frac{\pi(x-u)^2}{\lambda z}\right) \cdot du$$

The line length control integral in equation (7) is a function of only one variable and therefore can be numerically evaluated relatively quickly, alternatively it can be expressed as a Fresnel Integral whose values are tabulated in most mathematical software packages.

An equivalent expression for a line at an angle α to the optical axis is given by: (Eq. 8)

$$H(x, y) = \exp\left(j\frac{\pi y^2}{\lambda z_x}\right) SINC\left(\frac{wy}{\lambda z_x}\right) \int_{-h/2}^{h/2} \exp\left(j\frac{\pi(1+\tan^2(\alpha))(x-u)^2}{\lambda z_x}\right) \cdot du$$

FIG. 3 shows a line diffraction pattern 30 and a image plane 32 separated by a distance z. When a light source 34 is diffracted by the diffraction pattern 30, a line segment 36 is formed by the light source 34 on the image place 32. An intensity plot 38 shows the intensity of light across the image plane 32 corresponding to the length of the line segment 36.

A threshold 40 shows the light intensity required to activate a photoresist and therefore shows the definition of the line segment.

FIG. 4 has substantially the same features as FIG. 3 and therefore has like reference numerals for like items. In FIG. 4 the diffraction pattern 30 has been rotated through 90° thereby rotating the line segment 36 through 90°. An intensity plot 42 across the image plane 32 is now formed with a single thin peak corresponding to the width of the line segment 36.

By superimposing a number of the line-segment diffraction patterns described in equations (7) and (8) a holographic diffraction pattern is created for the geometric shape of interest. This enables circuit tracks to be created over an arbitrary piecewise planar surface. In this context, a "piecewise planar surface" is a surface constructed from planar surfaces at various angles and orientations.

Superimposing, in this case, involves vectorially adding the complex solution of the line diffraction patterns to generate the holographic diffraction pattern. "Complex" in this sense relates to complex numbers, as the solution of the line diffraction patterns will have both amplitude and phase components.

When the line-segment diffraction patterns are superimposed, points at which two or more line segments intersect generate an image in which the intensity at the intersection is much greater than the rest of the line-segments. This can result in over exposure of the photoresist in this area. To eliminate this effect, the diffraction pattern from a single point located at the intersection of the two lines is calculated and the result subtracted from the original mask. The diffraction of light from the point pattern will destructively interfere with the line segment patterns and reduce the intensity at the intersection appropriately.

Where the line-segment diffractions patterns are better described as rectangles rather than lines, that is they have significant width, an area diffraction pattern from the overlapping section must be subtracted. For example, when two intersecting line-segments of equal width intersect a square diffraction pattern representing the intersection must be generated and subtracted from the overall image.

To further reduce the complexity of calculations required, and therefore reduce processing time on a computer, each line-segment diffraction pattern is localised on the hologram plane. This is achieved by calculating a partial line-segment diffraction pattern for an area on the hologram plane less than the total area of the hologram plane. The partial line segments are then added vectorially whilst maintaining their relative positions in the hologram plane to create the holographic diffraction pattern.

Localisation relies on the superposition of individual line-segment CGH calculated over an area smaller than the area of the mask. The size of the calculation area determines the quality of the resulting line image on the substrate and is limited by the resolution of the CGH mask. The calculation area can be chosen as the largest area allowable for the given CGH mask resolution.

Localisation of the CGH calculation area to the region directly above the corresponding substrate area means smaller mask-substrate separations can be achieved for a given mask resolution. It is important to ensure that higher diffraction orders from each line segment are attenuated sufficiently such that when combined their intensity is less than the fixing threshold of the photo-resist.

The holographic diffraction pattern can then be converted to a format suitable for fabrication. The real part of equation (7) is quantised into n greyscale levels. As shown in FIG. 5, the amplitude of the resulting matrix is then encoded into a greyscale layer as a rectangle of area proportional to the greyscale value contained within each sample cell. This pattern can then be transferred onto a mask blank using standard processing techniques (i.e. selective etching of chrome coating on mask blank).

It should be appreciated that this is only one of a number of possible ways of making a mask. It could be envisaged that a continuous tone mask could be used in place of a mask with a number of greyscale levels.

In alternative (maskless) embodiments, a fixed holographic mask may be replaced by one or more Spatial Light Modulator (SLM). FIG. 8 shows an embodiment where the fixed mask is replaced by a single reflective SLM. FIG. 9 shows an embodiment where the fixed mask is replaced by two transmissive SLM's. The SLMs control light amplitude and or phase in a programmable and time-varying way, in an analogous fashion to fixed glass masks. A single SLM may be used in conjunction with a light source 114, beam shaper 116 and computer 118 in order to realise binary amplitude modulation type CGH's. A dual SLM system (shown in FIG. 9) can be used to realise full complex CGH mask designs. No fundamental alterations are required to the CGH calculations previously described, although it may be desirable to optimise a CGH pattern for best performance under SLM modulation. SLM's have already been employed to project holograms enabling ultra high speed data storage, but they have not been used for holographic photolithography. Replacement of the mask with an SLM allows numerically controlled holograms to be rapidly produced and projected. It allows sequences of such holograms to be projected sequentially and enables step-and-repeat, step-and-scan and multiple exposure methods. This in turn enables exposure over large surfaces, with finer detail and the creation of more complex images.

This system also allows a mechanical scanning system (not shown) to scan the SLM's over large area substrates, thus removing the limitation of mask size. In this regard, such a mechanical scanning system actually exploits the inherent localisation of the previously described CGH designs, such that the active area of the SLM is matched to the local area of the CGH. It should be noted that other embodiments of maskless systems are possible besides those depicted in FIGS. 8 and 9.

When generating two phase levels, the sign of the real part of equation (7) can be realised using a technique employed to generate phase-shift masks. This could mean either the selective etching of the mask substrate or the patterning of a transparent layer deposited on the mask. The depth of the pattern corresponds to a 180° phase-shift to the transmitted light.

It is possible that additional phase levels can be generated and used within the mask to further improve the CGH. For example, the embodiment of two levels of phase could be extended to four or more levels or even to a continuous range of phase shifts.

The amplitude and phase-shift layers are co-aligned. It is possible to deposit the chrome either before or after the patterning of the phase-shift layer.

Referring now to FIG. 6, a monochromatic light source 60, which in this case is a laser, emits monochromatic light towards a collimator 62. The collimator 62 generates a parallel beam 64 which is directed towards a holographic diffraction pattern 66. The monochromatic light is diffracted by the holographic diffraction pattern onto a non-planar substrate 68. The substrate 68 has a layer of photoresist (not shown) from which exposed or unexposed areas may be removed to enable other processes, such as etching, to be performed.

A non-planar and possibly complicated substrate geometry still requires an even layer of photoresist. When patterning a nominally 'flat' substrate, such as a semi-conductor wafer or a printed circuit board, the photoresist is generally applied by either spinning a liquid precursor or laminating a dry-film. These methods are not suitable for grossly non-planar surfaces since they do not enable a uniform-thickness layer of photoresist to be deposited. Spray nozzles have been developed that allow modest topographies to be covered uniformly, but for grossly non-planar surfaces the preferred method is to use an electro-depositable photoresist (EDPR).

Therefore, photolithography can be applied to grossly non-planar surfaces through the generation of a holographic mask and use of EPDR. Complicated circuits can now be patterned on non-planar substrates without re-shaping masks but through the use of the present invention.

Referring now to FIG. 7a and FIG. 7b, a computer generated hologram photolithography system 70 for etching a substrate 92, firstly, has a number of geometric shapes inputted 72. The geometric shapes 72 are then defined in three-dimensional sampled space 74. A CGH 76, or holographic diffraction pattern, is generated from the sampled space 74 as described previously. The CGH 76 is converted into a holographic mask by:
  binarising the CGH 78;
  generating greyscale and phase distributions 80;
  creating machine-format patterns 82;
  adding alignment marks 84;
  plotting the master greyscale and phase masks 86;
  create binary amplitude phase mask 88;
  create greyscale and phase mask from masters 90;
  aligning a photoresist coated substrate to a CGH mask, the CGH mask being the greyscale and phase mask (step 92) and binary amplitude phase mask (step 88) combined;
  exposing the substrate with a suitable light source 94; and
  developing exposed photoresist 96.

If a negative acting photoresist is being used the process continues by:
  etching exposed seed layer 98;
  stripping photoresist 100; and
  an optional step of increasing thickness of circuitry by electro or electroless plating 102.

If a positive acting photoresist is being used the process continues by:
  increasing thickness of exposed circuitry 104;
  stripping photoresist 106; and
  etching exposed seed layer 108.

For example, the following applications are enabled through the present invention:
  Conical Spiral Antennae—using a conical log-spiral geometry for an antenna results in a wideband receiver with a highly directional beam pattern and very little backscatter. This type of antenna is useful in GPS and radar applications and possibly the emerging Ultra-Wideband (UWB) technology. Conventionally such an antenna is difficult to construct accurately and involves bending pre-etched flexible arms onto a former. The present invention has enabled photolithography which can produce high resolution tracks directly imaged onto the antenna substrate.
  Novel Print Head Architectures—the present invention can be used in the etching of a novel print head assembly involving tracks running over stepped piezoelectric surfaces, a process that typically requires a direct laser writing procedure.

System assembly—sensors, integrated chips and discrete components may be connected together on a system board, having two or three dimensions, using the present invention. That is, the present invention enables deposition of interconnects via photolithography/etching rather than high temperature soldering, which is advantageous for delicate sensors and integrated circuits. Even for a flat system board, there is still a need for laying down fine pitch interconnects between, essentially, non-planar components.

Although the present invention has been described with particular reference to generating holograms for use with a three-dimensional surface, generation of holograms for two-dimensional surfaces is as equally applicable.

As the substrate size moves to liquid crystal flat panel display dimensions and beyond, the need for 100% defect free quality is paramount. The yield achieved for these sorts of dimensions is extremely low for many prior art lithography systems due to the size of the substrate. Holographic lithography in general improves yield as dust particles and other imperfections are less destructive to the creation of circuits due to multiple light paths.

The present invention obviates or mitigates the traditional restrictions in size associated with prior art holographic lithography systems. In particular, with prior art holographic lithography systems, large two-dimensional substrates suffer from spherical aberrations towards the edges of the substrates. The present invention includes corrections for spherical aberrations inherently in the creation of a diffraction pattern.

In addition, the present invention enables the photolithographic patterning of non-planar optical wave guide structures onto substrates such as, for example, a printed circuit board. The wave guide structures could be used to enable light to be coupled (optical interconnects) between optical components (such as laser diodes or photo-diode detectors), thus helping to facilitate high-speed optical inter-chip communication. The wave guide structures will be non-planar, since they must enable light to be coupled between the vertical axis and the horizontal plane. The structures may involve angled surfaces that constitute reflective mirrors or embedded refractive index changes that constitute refractive mirrors.

The technique is not restricted to photolithography and may be applied to other types of lithography in substantially the same manner.

For the purpose of clarity, the diagrams and equations associated with the present invention represent zero order holograms. It should be appreciated that both the diagrams and equations can be modified to represent $n^{th}$ order holograms without departing from the scope of the invention.

Improvements and modifications may be incorporated without departing from the scope of the present invention.

The invention claimed is:

1. A computer implemented method of generating a holographic diffraction pattern, the computer implemented method comprising the steps of:
   (i) defining at least one three-dimensional geometrical shape;
   (ii) generating at least one rectangular line segment of predetermined width and length to represent the at least one geometrical shape;
   (iii) calculating, using a computer, a diffraction pattern of the at least one rectangular line segment on a hologram plane, including calculating a Fresnel diffraction equation for the at least one rectangular line segment with a line width control term and a line length control term; and
   (iv) adding vectorially, where there are two or more rectangular line segments, the diffraction patterns to form the holographic diffraction pattern;
   the method being characterized in that: said line width control term and said line length control term are functions of a distance between the rectangular line segment and the hologram plane, said distance being along an optical axis of the hologram plane.

2. A method as claimed in claim 1, wherein the line width control term is $$SINC\left(\frac{wy}{\lambda z_x}\right)$$

where w is the width of the line segment, x and y are axes of a hologram coordinate plane, $z_x$ is a distance between a mask and a substrate at a given position along the x-axis, and $\lambda$ is a wavelength of a suitable radiation source.

3. A method as claimed in claim 1, wherein the line length control term is $$\int_{-h/2}^{h/2} \exp\left(j\frac{\pi(1+\tan^2(\alpha))(x-u)^2}{\lambda z_x}\right) du$$

where h is the length of the line segment, x is an axis of a hologram coordinate plane, u is an axis of an object coordinate plane, zx is a distance between a mask and a substrate at a given position along the x-axis, (90-α) is an angle with respect to the optical axis (z), and $\lambda$ is the wavelength of a suitable radiation source.

4. A method as claimed in claim 1, wherein step (iii) comprises calculating a partial holographic pattern representing an area of the holographic plane less than the total area of said holographic plane.

5. A method according to claim 4, wherein sampling of said holographic pattern results in higher diffraction orders of the at least one geometrical shape upon exposure using monochromatic light, copies being of a lesser intensity than the at least one geometrical shape.

6. A method according to claim 5, a combined intensity of the geometrical shape and the higher diffraction orders is less than a fixing threshold of an applied layer of photoresist.

7. A method as claimed in claim 1, wherein the method further comprises a step of identifying any area in the at least one geometrical shape wherein two or more rectangular line segments will cross, calculating an area diffraction pattern of an identified area and subtracting the area diffraction pattern from the holographic diffraction pattern.

8. A non-transitory computer program product directly loadable into an internal memory of a digital computer comprising software code portions for performing the method according to claim 1.

9. A method as claimed in claim 1, further comprising a step of:
   providing a holographic lithography system including:
      geometrical shape definition means for defining a three-dimensional geometrical shape, and wherein the step of defining at least one three-dimensional geometrical shape is accomplished using the geometrical shape definition means;

holographic diffraction generation means, wherein the geometrical shape is defined by at least one rectangular line segment of predetermined width and length, a diffraction pattern is calculated on a hologram plane, where said line width and said line length are represented in the hologram by functions of positions on an optical axis of the hologram plane, and, where there is more than one line diffraction pattern, the line diffraction patterns are added vectorially together to form a holographic diffraction pattern;

holographic mask generation means, wherein complex values of the holographic diffraction pattern are used to generate a holographic mask;

photoresist deposition means, wherein photoresist is deposited onto a substrate; and monochromatic light exposure means, wherein the holographic mask is aligned to the substrate and exposed to the monochromatic light.

10. A method as claimed in claim 9, further comprising a step of operating the photoresist deposition means to apply a uniform thickness photoresist layer over the substrate.

11. A method as claimed in claim 10, further comprising a step of depositing electro-depositable photoresist using the photoresist deposition means.

12. A method as claimed in claim 10, wherein the photoresist deposition means comprises a plurality of spray nozzles in a predetermined arrangement, and the method comprises a step of operating one or more of the spray nozzles to deposit photoresist.

* * * * *